United States Patent [19]

Lee et al.

[11] Patent Number: 5,313,066

[45] Date of Patent: May 17, 1994

[54] ELECTRONIC METHOD AND APPARATUS FOR ACQUIRING AN X-RAY IMAGE

[75] Inventors: Denny L. Y. Lee, West Chester, Pa.; Lothar S. Jeromin, Newark, Del.

[73] Assignee: E. I. Du Pont de Nemours and Company, Wilmington, Del.

[21] Appl. No.: 44,427

[22] Filed: Apr. 7, 1993

Related U.S. Application Data

[63] Continuation-in-part of Ser. No. 886,661, May 20, 1992, abandoned.

[51] Int. Cl.$^5$ .............................................. G01N 23/04
[52] U.S. Cl. ............................ 250/370.09; 250/580; 378/28
[58] Field of Search ........... 250/336.1, 370.01, 370.09, 250/370.08, 327.2 R, 327.2 C, 580, 591; 378/28, 31, 62; 358/111

[56] References Cited

U.S. PATENT DOCUMENTS

| | | | |
|---|---|---|---|
| 2,866,903 | 12/1958 | Berchtold | 378/28 |
| 3,748,380 | 7/1973 | Kohashi | 358/111 |
| 3,973,146 | 8/1976 | Arnold et al. | 357/26 |
| 4,030,922 | 6/1977 | Honjo et al. | 378/28 |
| 4,085,327 | 4/1978 | Swank et al. | . |
| 4,134,137 | 1/1979 | Jacobs et al. | 358/293 |
| 4,176,275 | 11/1979 | Korn et al. | . |
| 4,268,750 | 5/1981 | Cowart | 250/315.1 |
| 4,446,365 | 5/1984 | Ong et al. | . |
| 4,508,966 | 4/1985 | Oberschmid et al. | . |
| 4,521,808 | 6/1985 | Ong et al. | 358/111 |
| 4,535,468 | 8/1985 | Kempter | 378/31 |
| 4,539,591 | 9/1985 | Zermeno et al. | 358/335 |
| 4,554,453 | 11/1985 | Feigt et al. | . |
| 4,663,526 | 5/1987 | Kamieniecki | 250/315.3 |
| 4,670,765 | 6/1987 | Nakamura et al. | 357/30 |
| 4,694,317 | 9/1987 | Higashi et al. | 357/30 |
| 4,818,857 | 4/1989 | Micheron et al. | . |
| 4,857,723 | 8/1989 | Modisette | 250/327.2 X |
| 4,873,436 | 10/1989 | Kamieniecki et al. | 250/327.2 X |
| 4,961,209 | 10/1990 | Rowlands et al. | 378/29 |
| 4,975,935 | 12/1990 | Hillen et al. | 378/28 |
| 5,059,794 | 10/1991 | Takahashi et al. | 250/327.2 |
| 5,127,038 | 6/1992 | Jeromin et al. | 378/28 |
| 5,166,524 | 11/1992 | Lee et al. | 250/327.2 |
| 5,168,160 | 12/1992 | Jeromin et al. | 250/327.2 |
| 5,182,624 | 1/1993 | Tran et al. | 257/40 |

FOREIGN PATENT DOCUMENTS 0125691 11/1984 European Pat. Off. .
63-3454 1/1988 Japan .

OTHER PUBLICATIONS

L. E. Antonuk et al., Development of Thin Film, Flat Panel Arrays for Diagnostic and Radiotherapy Imaging, *Conference Proceedings of SPIE Medical Imaging VI*, Newport Beach, Calif., Feb. 23-27, 1992.

L. E. Antonuk et al., Large Area Amorphous Silicon Photodiode Arrays for Radiotherapy and Diagnostic Imaging, *Nuclear Instruments and Methods in Physics Research*, A310, 460-464, 1991.

L. E. Antonuk et al., Development of Hydrogenated Amorphous Silicon Sensors for Diagnostic X-Rays Imaging, *IEEE Transactions on Nuclear Science*, 38, No. 2, Apr. 1991.

L. E. Antonuk et al., Development of Hydrogenated Amorphous Silicon Sensors for High Energy Photon Radiotherapy Imaging, *IEEE Transactions on Nuclear Science*, 37, No. 2, Apr. 1990.

L. E. Antonuk et al., Signal, Noise, and Readout Considerations in the Development of Amorphous Silicon Photodiode Arrays for Radiotherapy and Diagnostic X-Ray Imaging, *Medical Imaging V: Imaging Physics*, 1443, 108-119, Feb. 25-26, 1991.

E. B. Lipscomb, III, Structural Limitations in Method Claims, *Walker on Patents*, 3, 11-12, 1985.

*Primary Examiner*—Constantine Hannaher
*Assistant Examiner*—Edward J. Glick

[57] ABSTRACT

An X-ray image capturing element comprising a panel having a layered structure, including a conductive layer comprising a plurality of discrete microplates having dimensions co-extensive with an image pixel and a plurality of access electrodes and electronic components built on the panel, which allow access to the microplates for capturing and reading out a latent radiographic image captured in the panel in the form of stored electrical charges.

9 Claims, 9 Drawing Sheets

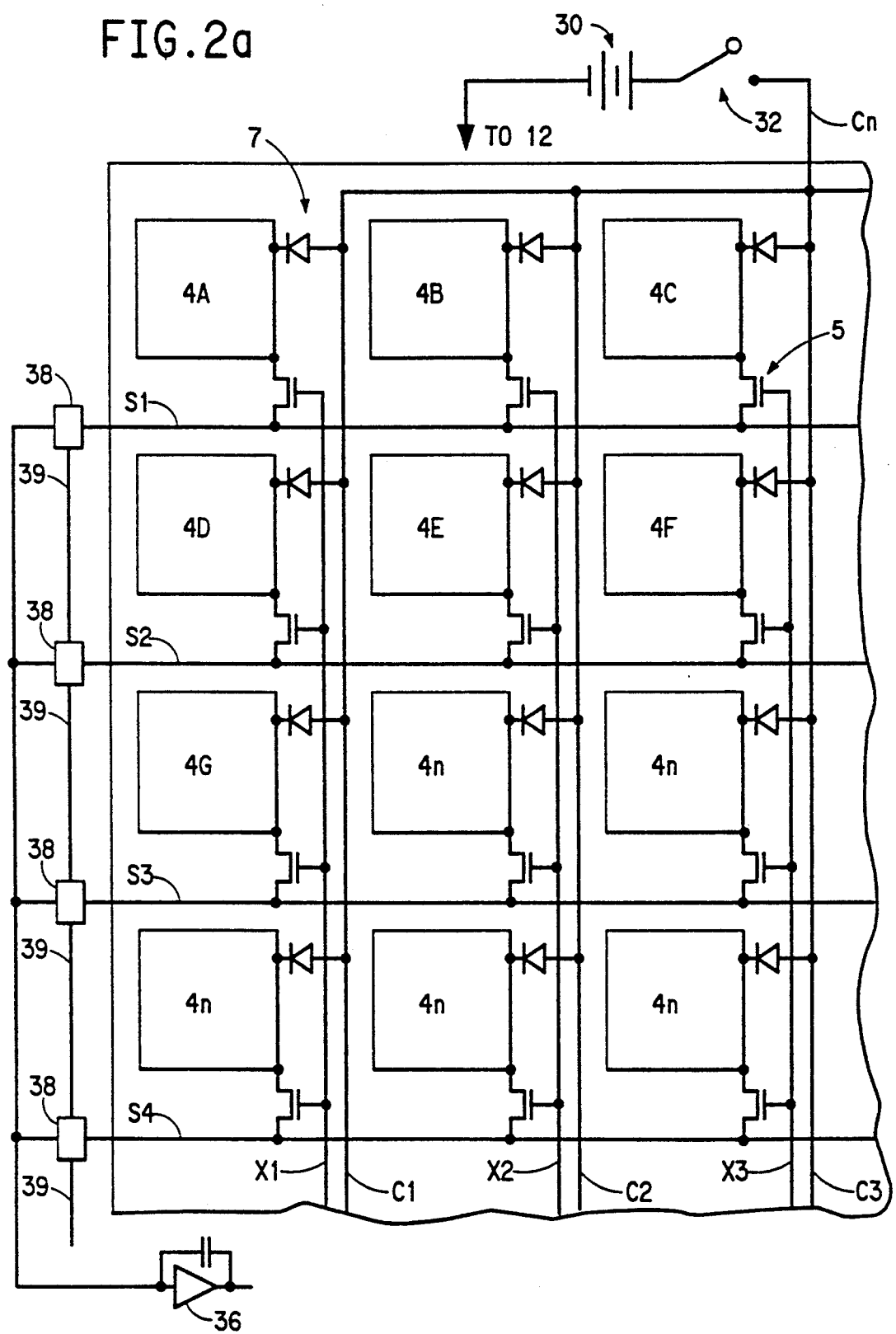

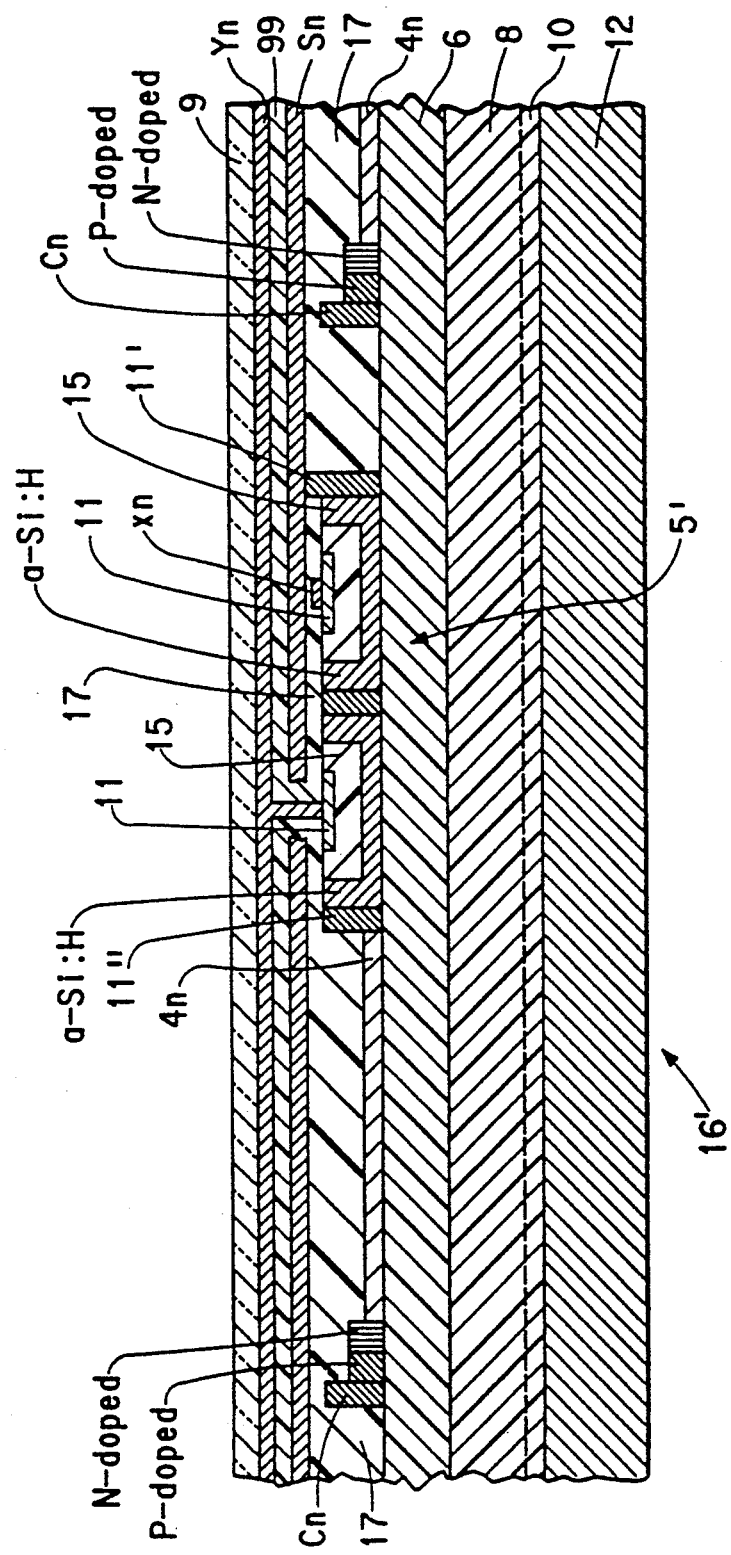

ELECTRONIC METHOD AND APPARATUS FOR ACQUIRING AN X-RAY IMAGE

CROSS REFERENCE TO RELATED APPLICATIONS

This is a continuing application specifically a continuation-in-part application, of copending U.S. patent application Ser. No. 07/886,661 filed May 20, 1993, now abandoned.

BACKGROUND OF THE INVENTION

Field of the Invention

The present invention relates to a method and apparatus for capturing digital radiographic images. More particularly, the present invention relates to a method and associated apparatus for capturing and readout of electrical charges representing a latent radiographic image in a unique microcapacitor matrix panel to obtain an electrical signal representing a radiogram.

Description of Related Art

Traditional radiography employs a silver halide photosensitive film in a light tight cassette enclosure, to capture a latent radiographic image, which is subsequently rendered visible following chemical development and fixing. Because silver halide film is not very sensitive to X-ray radiation, and large exposures are required to obtain an image, most applications use a combination of an intensifying screen comprising a phosphor layer incorporated in the cassette, with the silver halide film to achieve lower exposures.

Radiograms have also been produced by capturing a latent radiographic image using a photoconductive plate in a xeroradiographic process. In this instance, a photoconductive plate sensitive to X-ray radiation comprising at least a photoconductive layer coated over a conductive backing layer is first charged by passing under a charging station typically comprising a corona wire. Positive or negative charge is uniformly deposited over the plate surface. The plate is next exposed to X-ray radiation. Depending on the intensity of the incident radiation, electron hole pairs generated by the X-ray radiation are separated by a field incident to the charge laid over the surface and as a result move along the field to recombine with the surface charge. After X-ray exposure, a latent image in the form of electrical charges of varying magnitude remain on the plate surface, representing a latent electrostatic radiogram. This latent image may then be rendered visible by toning and preferably transferring onto a receiving surface for better viewing.

More recent developments include the use of an electrostatic image capture element to capture a latent X-ray image, the element comprising a photoconductive layer over an insulating layer on a conductive support, the photoconductive layer also covered by a dielectric layer, and the dielectric layer overcoated with a transparent electrode. A biasing voltage is applied between the transparent electrode and the conductive support to charge the element which is a large parallel plate capacitor. While the bias voltage is applied, the element is exposed to image wise modulated X-ray radiation. Following exposure, the bias is removed and a latent image is preserved as a charge distribution stored across the dielectric layer. The problem with this element structure is that the latent image represented by local charge variations is a very small signal charge that must be extracted in the presence of random noise in the total capacitive charge in the full plate. Signal to noise ratio is typically poor.

In an effort to improve the signal to noise ratio, the transparent electrode is laid over the dielectric layer as a plurality of pixel size microplates having an area commensurate with the area of the smallest resolvable element in the image. In this manner, the overall plate capacity is reduced and the signal extracted per picture element has a better signal to noise ratio. Methods to readout the latent image include, inter alia, scanning the length of the strip electrode with a laser beam while reading the charge flow from each of the microcapacitors formed between the microplates and the conductive plate. While this element is a vast improvement over the continuous electrode structure covering the full plate, the mode of use of this plate is somewhat complex particularly with respect to the manner in which the original charging of the microplates occurs.

SUMMARY OF THE INVENTION

The invention is related to an X-ray image capture element, comprising:

a first, electrically conductive, backing layer;

a second, photoconductive layer responsive to both actinic and X-ray radiation extending substantially over said backing layer;

a third, dielectric layer substantially transparent to both actinic and X-ray radiation, the dielectric layer having a back surface extending substantially over and in contact with said photoconductive layer and a front surface;

a plurality of discrete conductive microplates substantially transparent to both actinic and X-ray radiation, said microplates arranged on said front surface with a space between adjacent microplates, each of said microplates having dimensions coextensive with a minimum resolvable picture element;

a first plurality of discrete conductive Xn address lines extending along the microplates;

a second plurality of interconnected conductive charge lines extending along said microplates;

a third plurality of discrete conductive sense lines extending along said microplates;

each microplate being connected to one adjacent of said plurality of charge lines with a diode; and each microplate also connected to said Xn address and sense lines via a transistor.

It is also within the scope of this invention to provide an element as hereinabove described, further comprising a fourth plurality of discrete Yn address conductive lines extending along the microplates in a direction across the Xn address lines, and wherein each of the microplates is connected to the Xn address, the Yn address and the sense lines via at least two transistors.

Preferably, both elements have the plurality of the Xn address and Yn address lines laid out orthogonally on the front surface of the element in the spaces between the microplates, and the charge and sense lines are also laid out parallel to the Xn address and Yn address lines.

The invention is further related to a method for capturing a radiogram on an X-ray image capture element, comprising:

a first, electrically conductive, backing layer;

a second, photoconductive layer responsive to both actinic and X-ray radiation extending substantially over said backing layer;

a third, dielectric layer substantially transparent to both actinic and X-ray radiation, the dielectric layer having a back surface extending substantially over and in contact with said photoconductive layer and a front surface;

a plurality of discrete conductive microplates substantially transparent to both actinic and X-ray radiation, said microplates arranged on said front surface with a space between adjacent microplates, each of said microplates having dimensions coextensive with a minimum resolvable picture element, the microplates and backing layer forming a plurality of microcapacitors;

a first plurality of discrete conductive Xn address lines extending along the microplates;

a second plurality of interconnected conductive charge lines extending along said microplates;

a third plurality of discrete conductive sense lines extending along said microplates terminating in an input of a charge detecting device for producing an output signal representative of the charge detected in its input;

each microplate being connected to one adjacent of said plurality of charge lines with a diode; and each microplate also connected to said Xn address and sense lines via a transistor, the method comprising:

(a) preventing actinic radiation from impinging on said element;

(b) applying a positive voltage across said interconnected charge lines to develop an electric potential difference between said plurality of discrete conductive microplates and said backing layer;

(c) impinging imagewise modulated X-ray radiation for a first time period onto the element;

(d) after the first time period, stopping the applying step to trap in the microcapacitors electrical charges proportional to the intensity of the impinging radiation on the microplates;

(e) while exposing the element to actinic radiation, applying a positive voltage to one of said plurality of Xn address lines to render the transistors connecting said one Xn address line and the sense lines to the microplates, conductive, to discharge said microcapacitors into the sense line and the charge detecting device input and produce an output signal on each of said plurality of charge detecting devices;

(f) sequentially detecting the output signals for each sense line; and (g) repeating steps (e) and (f) for each of said plurality of Xn address lines until all signals from all microplates have been detected.

Optionally, an additional step of exposing the element to uniform radiation for a second time period may be employed, prior to step (e).

The invention is further related to a method for capturing a radiogram on an X-ray image capture element, comprising:

a first, electrically conductive, backing layer;

a second, photoconductive layer responsive to both actinic and X-ray radiation extending substantially over said backing layer;

a third, dielectric layer substantially transparent to both actinic and X-ray radiation, the dielectric layer having a back surface extending substantially over and in contact with said photoconductive layer and a front surface;

a plurality of discrete conductive microplates substantially transparent to both actinic and X-ray radiation, said microplates arranged on said front surface with a space between adjacent microplates, each of said microplates having dimensions coextensive with a minimum resolvable picture element, the microplates and backing layer forming a plurality of microcapacitors;

a first plurality of discrete conductive Xn address lines extending along the microplates;

a second plurality of interconnected conductive charge lines extending along said microplates;

a third plurality of conductive Yn address lines extending along said microplates in a direction across said first plurality of Xn address lines;

a fourth plurality of conductive sense lines extending along said microplates;

each microplate being connected to one adjacent of said plurality of charge lines with a diode; and each microplate also connected to said Xn address, Yn address, and sense lines via two transistors, the method comprising:

(a) preventing actinic radiation from impinging on said element;

(b) applying a positive voltage across said interconnected charge lines to develop an electric potential difference between said plurality of discrete conductive microplates and said backing layer;

(c) impinging imagewise modulated X-ray radiation for a first time period onto the element;

(d) after the first time period, stopping the applying step to trap in the microcapacitors electrical charges proportional to the intensity of the impinging radiation on the microplates;

(e) optionaly exposing the element to uniform radiation for a second time period;

(f) while exposing the element to actinic radiation, applying a voltage to one of said Yn address lines and one of said plurality of Xn address lines to render the transistors connecting said one Xn address line, said one Yn address line and one of said sense lines to one of said microplates conductive so as to produce an output signal on said one sense line;

(g) detecting the output signal on the sense line; and (h) repeating steps (f) and (g) for each of said plurality of Yn address and Xn address lines until all signals from all microplates have been detected.

BRIEF DESCRIPTION OF THE DRAWINGS

The invention can be more fully understood from following detailed description thereof in connection with accompanying drawings described as follows.

FIG. 2a s a schematic top view of the embodiment of the X-ray capture element shown in FIG. 1 having an alternate readout arrangement.

FIG. 3 shows a schematic cross sectional elevation view of an alternate embodiment of an X-ray capture element in accordance with the present invention.

DESCRIPTION OF THE PREFERRED EMBODIMENT(S)

Figure 1:
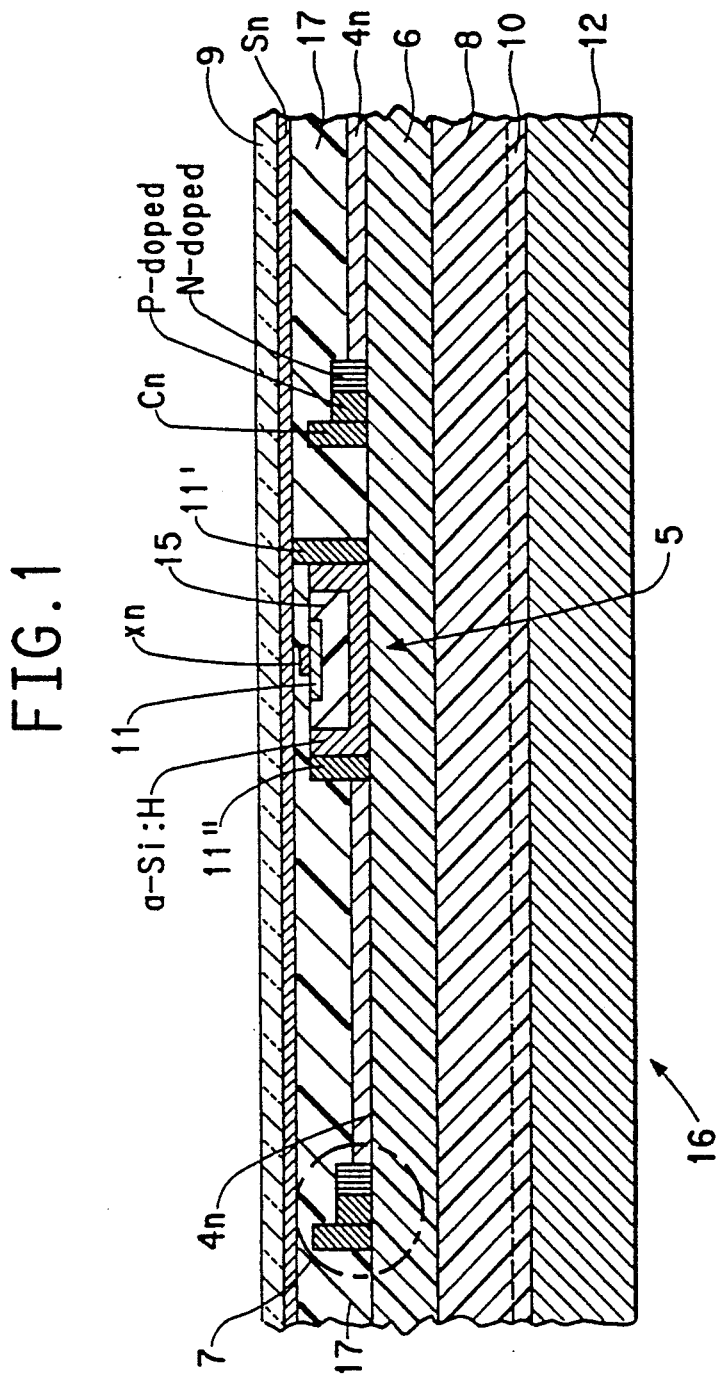
FIG. 1 shows a schematic cross sectional elevation view of an X-ray capture element in accordance with the present invention.

Throughout the following detailed description, similar reference characters refer to similar elements in all figures of the drawings.

Referring to FIG. 1, an X-ray image capture apparatus, element or panel 16 is depicted having a first conductive backing layer 12. This conductive backing layer 12 is made of conductive material, and may be rigid or flexible, transparent or non-transparent. Preferably it is a continuous layer made of a sufficiently thick and rigid conductive material to serve as a support for other layers included in the image capture element 16. In its simpler structure, there is coated over the conductive backing layer 12 a photoconductive layer 8 having a back surface in contact with the conductive backing layer 12, and a front surface. The photoconductive layer 8 preferably exhibits very high dark resistivity.

The photoconductive layer 8 may comprise amorphous selenium, lead oxide, cadmium sulfide, mercuric iodide or any other such material, including organic materials such as photoconductive polymers preferably loaded with X-ray absorbing compounds, which exhibit photoconductivity.

In the context of the present invention, exhibiting photoconductivity means that upon exposure to actinic or X-ray radiation, the material exhibits reduced resistivity than in the absence of such exposure. The reduced resistivity is in reality the effect of electron hole pairs generated in the material by the incident radiation. Preferably, the change in apparent resistivity is proportional to the intensity of the incident radiation. By actinic radiation, again for purposes of describing the present invention, is meant Ultraviolet (U.V.), infrared (I.R.), visible, or gamma-radiation but excludes X-ray radiation.

The photoconductive layer 8 should be chosen of sufficient thickness to absorb the incident X-ray radiation, or a substantial portion thereof, to provide high efficiency in radiation detection. The specific type of material selected will further depend upon the desired charge retention time, and the desired simplicity of manufacture. Selenium is one preferred such material.

Over the front surface of photoconductive layer 8 there is applied a dielectric layer 6. The dielectric layer 6 must be transparent to both X-ray and actinic radiation and have sufficient thickness to prevent charge leakage. In the preferred embodiment of the present invention, dielectric layer 6 should have a thickness greater than 100 Angstroms. Mylar ® (i.e., polyethylene terephthalate) sheeting, with a thickness of 50 micrometers may be used for layer 6, although thinner layers are suitable.

Figure 2:
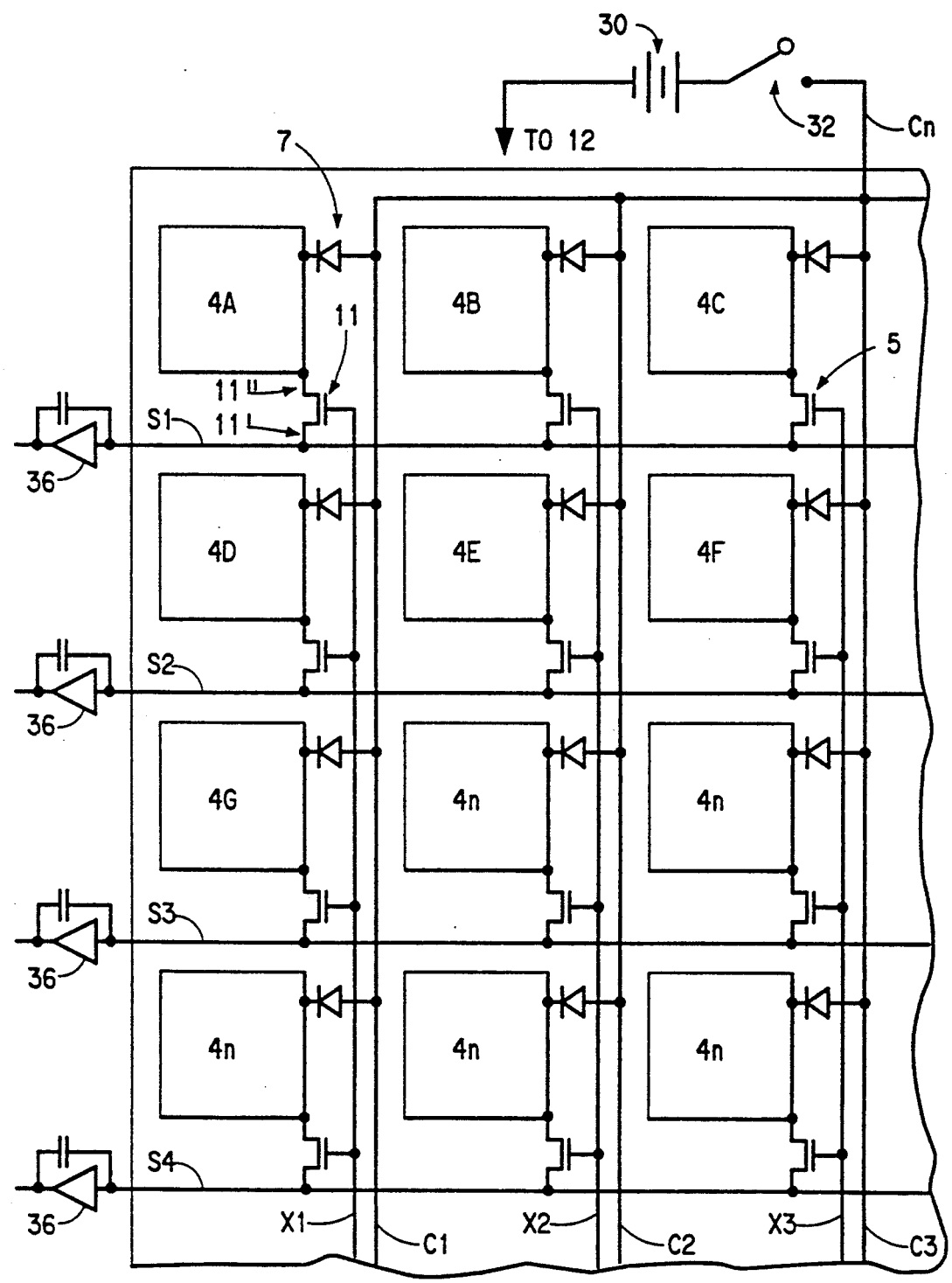
FIG. 2 is a schematic top view of the embodiment of the X-ray capture element shown in FIG. 1.

As better shown in FIG. 2, over the dielectric layer 6 there is created a plurality of discrete minute conductive electrodes 4 (i.e., 4a, 4b, 4c, . . . 4n) referred to herein as microplates. The dimensions of the microplates define the smallest picture element (PIXEL) resolvable by the element 16. The electrodes 4 are substantially transparent to both actinic and X-ray radiation. They are deposited on dielectric layer 6 typically, though not necessarily, using vapor or chemical deposition techniques and can be made of a very thin film of metal, such as gold, silver, aluminum, copper, chromium, titanium, platinum and the like. Preferably, the microplates 4 are made of transparent indium-tin oxide. The microplates 4 may be deposited as a continuous layer which is then etched to produce a plurality of individual discrete microplates having dimensions coextensive with a smallest resolvable picture element. The microplates 4 may also be produced using laser ablation or photoetching. The technology to produce such microplates 4 is well known in the art and is not further discussed herein. A good description of photomicrofabrication techniques is given in "Imaging Processing & Materials," Chapter 18, entitled "Imaging for Microfabrication," by J. M. Shaw of IBM Watson Research Center.

Each one of the microplates 4a, 4b, 4c, . . . 4n with the intermediate dielectric photoconductive layer 8, and backing conductive layer 12 form two microcapacitors in series, a first microcapacitor being created between the microplate 4 and the front surface of the photoconductive layer 8 and a second microcapacitor between that same surface and the conductive backing layer 12.

In an alternate and preferred structure, an optional charge barrier layer 10 (the top surface of which is shown by a dotted line in FIG. 1) is added on top of conductive layer 12. Preferably, the base layer 12 is made of an oxide forming metal such as aluminum. The charge barrier layer 10 is provided by an aluminum oxide layer formed on the surface of backing layer 12. In this case, the subsequent coating thereon of a selenium photoconductive layer 8 produces a barrier layer behaving as a blocking diode, inhibiting charge flow in one direction.

The charge barrier layer 10 may also be a simple insulating layer, such as polyethylene terephthalate, of dimensions comparable to the dielectric layer 6.

In the spaces between the microplates 4a, 4b, 4c . . . 4n conductive address lines X1, X2, . . . Xn, charge lines C1, C2, . . . Cn and sense lines S1, S2, . . . Sn are laid out. The Xn and Cn lines are shown parallel to each other while the Sn lines are shown orthogonal to the Xn and Cn lines. However, the Cn lines could also have been laid generally parallel to the Sn lines, or all lines could have been laid out parallel to each other in the spaces between the microplates 4, this being strictly a matter of convenience rather than a necessity. The Xn and Sn lines are individually accessible through connectors or leads not specifically illustrated in the drawings, along the sides or edges of the panel 16. The Cn lines are all interconnected and accessed through a connector, also on a side or edge of the panel 16. A single connector with multiple appropriately assigned contacts for the Xn, Sn and Cn lines may of course be provided.

For fabrication purposes, the Xn and Cn lines may be constructed from the same indium tin oxide layer used for fabricating the microplates 4, and produced during the aforementioned etching which may be used to make the microplates 4. Then the Sn lines may be created after placing an insulating layer 17 over the Xn and Cn lines. The reverse is of course also possible.

Connecting each microplate $4n$ to a Cn line is a diode 7 comprising P-doped and N-doped materials deposited over the dielectric layer 6 in the space between lines Cn and microplates $4n$, as shown in FIGS. 1 and 2. Also in the space between each microplate $4n$ and conductive lines Xn and Sn, there is built an FET transistor 5 having its gate connected to an Xn line and its source and drain connected to a microplate $4n$ and an Sn line, respectively. The FET transistor 5 may comprise a hydrogenated amorphous silicon (a-Si:H) layer, an insulating layer 15 and conductive electrodes 11, 11' and 11" forming the gate, drain and source, respectively, which are connected to lines Xn, Sn, and the microplate $4n$. The technology for the creation of the FET transistors 5 and the diodes 7 is well known in the art and not a subject of the present invention. See, for instance, "Modular Series on Solid Devices," Volume 5 of Introduction to Microelectronics Fabrication by R. C. Jaeger, Published by Addison-Wesley in 1988.

A final cover layer 9, which is a dielectric and can be a glass panel, may optionally be provided over the microplates 4, diodes 7, FETs 5, and conductive lines Sn,Xn,Cn, to provide protection to the various components and ease of handling.

FIG. 3 shows an alternate embodiment of an X-ray capturing element or panel 16' in accordance with the present invention in schematic elevation cross-section. The panel 16' again comprises a conductive support or layer 12 having an optional barrier layer 10 thereon. A photoconductive layer 8 is coated over the conductive layer 12 or the optional barrier layer 10 as the case may be. Over the photoconductive layer 8, there is again coated an insulating dielectric layer 6. A plurality of conductive microplates $4a$, $4b$, $4c$, ... $4n$ are again created over the insulating layer 6 the same as before.

Figure 4:
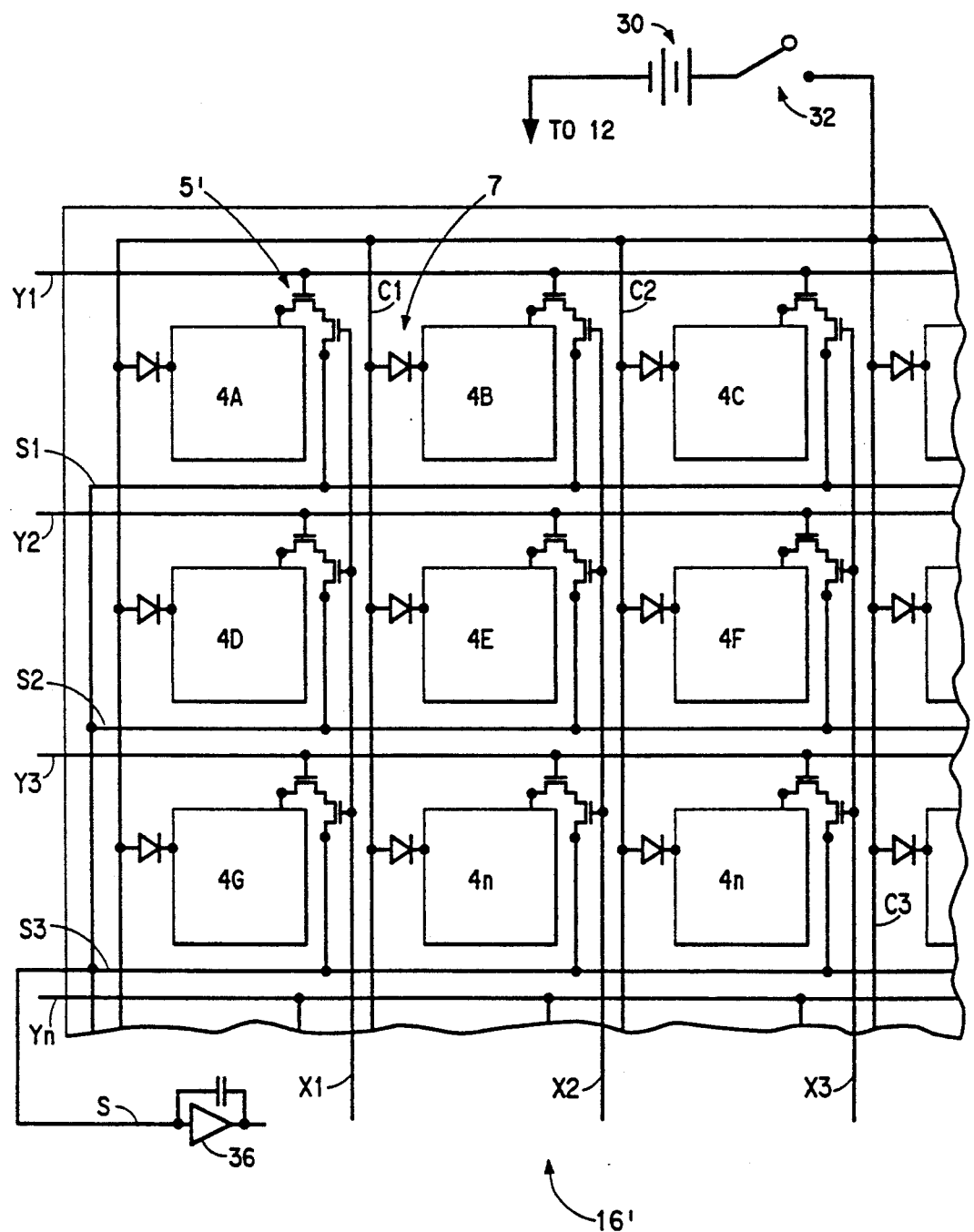
FIG. 4 is a schematic top view of the embodiment of the X-ray capture element shown in FIG. 3.

Referring now to FIG. 4, it is seen that in this embodiment, in addition to the Xn, Sn and Cn lines there is a fourth plurality of Y1, Y2, Y3 ... Yn address lines preferably extending across the Xn lines which are insulated from each other by insulation layer 99. Insulation layer 99 material is comparable to that of layer 17. In this embodiment, in addition to the diode 7 connecting the microplates 4 to the Cn lines, two a-Si:H FETs 5' are used connected back to back interconnecting the Xn, Yn, Sn lines and the microplates 4. In this arrangement, the gates of the two FETs are connected to the Xn and Yn lines, respectively, while the source of one of the FETs 5' is connected to the microplate $4n$ and the drain of the other one of the FETs 5' is connected to the Sn line. The Cn lines are again interconnected and have a single access from outside the panel 16'. Each microplate 4 is connected to a Cn line with a diode 7. The Xn, Yn, and Sn lines are all individually accessible through appropriate connections preferably along the panel sides or edges.

The entire element 16 or 16' can be made by depositing successive layers of conductor, insulator, photoconductor, insulator, and conductor upon a substrate. The diodes 7 and the FETs 5,5' can then be built in the spaces between the microplates 4 on the dielectric layer 6. Assembly may be accomplished by ion implantation, vapor deposition, vacuum deposition, lamination, sputtering or any other known technique useful to deposit even thickness films. The element 16 or 16' may also be fabricated by first building the active transistor and diode layers on a glass substrate. Subsequently, dielectric, selenium and other layers are deposited on top yielding the element 16 or 16'.

In the preferred embodiment, the conductive backing layer 12, the charge barrier layer 10, the photoconductive layer 8 and the dielectric layer 6 are all continuous layers. However, it is still within the contemplation of the present invention to manufacture an element for X-ray capture as herein above structured, in which not only the transparent electrode layer has been etched to produce a plurality of microplates 4, but one or more of the underlying layers may also be etched with substantially the same pattern as the electrode layer, to form a plurality of discrete dielectric portions, photoconductive portions, barrier layer portions or even conductive portions lying below the microplates 4 in registration therewith. Furthermore, rather than etching a continuous layer to generate the microplates 4, direct deposition of the microplates 4 using masking techniques may be used, the method of manufacturing being one of choice depending on available resources and cost considerations, rather than an essential element of the present invention.

In both panel structures depicted in FIGS. 1, 2, 3 and 4, there is provided connecting circuitry for connecting an electrical bias source 30 to the Cn line contact on the panel 16,16' and the backing layer 12, so as to apply a DC bias voltage across element 16,16'. When switch 32 is closed, the diodes 7 are forward biased and become conducting. The bias voltage then appears across the microplates $4n$ and the backing layer 12.

Returning now to the structure shown in FIGS. 1 and 2, in addition to the bias source 30, circuitry is also provided for connecting to the panel 16 preferably through a removable connector not illustrated, a plurality of charge detectors 36. Each detector 36 is connected to a Sn line. The charge detectors 36 may comprise an operational amplifier wired to measure the charge in a capacitive circuit in which the charge from the microcapacitors is directed to, and which produces a voltage output proportional to such charge. The output of detectors 36 may be sampled sequentially to obtain an output signal and the technology to do this is well known in the art. It is also possible to use a single charge detector with a sampling network arranged so as to sequentially apply the output of the Sn lines to the detector input FIG. 2a shows such an arrangement. In this case, switches 38 addressed through line 39 sequentially apply the lines Sn to an input of a single charge detector 36.

The Xn lines are also accessible from outside the panel 16 as stated earlier. A switching means not shown in the Figures may be used to address either sequentially or at will each of the Xn lines and to apply a voltage to each Xn line. Again the technology for sequentially addressing a plurality of lines on a panel is well developed and extensively used in the field of flat panel TV displays and need not be elaborated here, as the mode selected to perform such addressing is of no criticality to the subject matter of this invention.

In the case of the panel 16' depicted in FIGS. 3 and 4, in addition to the bias source 30 connected to the panel 16' and lines Cn, and the Xn addressing means discussed above, the Yn lines are also provided with sequential or at will addressing means similar to the means used for the addressing of the Xn lines. In this panel 16', the plurality of sense lines Sn are all interconnected either on the panel 16' itself, or after exiting the panel 16', and their combined output is directed to the input of a single charge detector 36.

Figure 5:
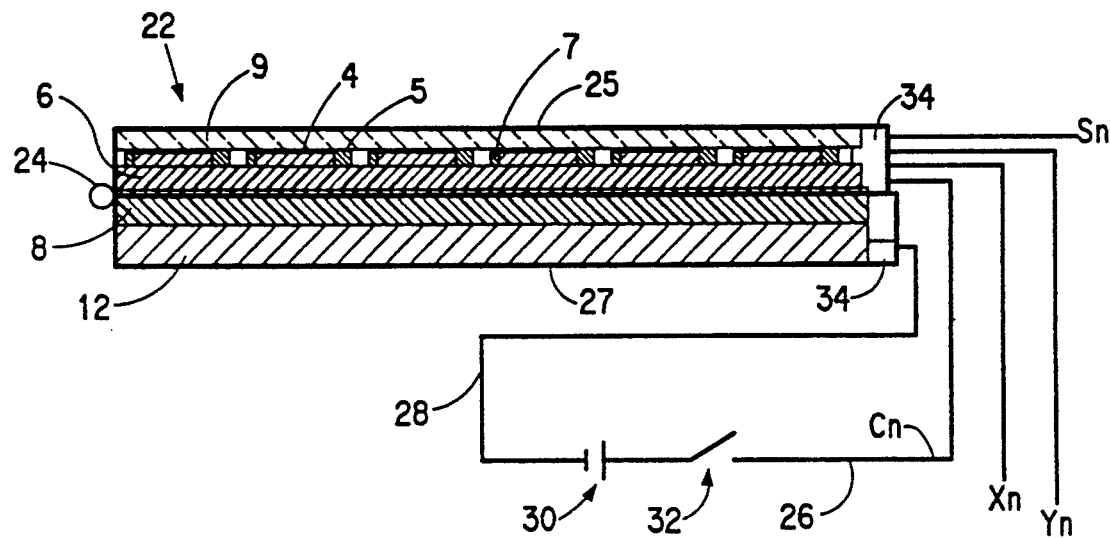
FIG. 5 shows in schematic representation a cassette like device for using an X-ray panel in accordance with this invention for capturing a latent X-ray image.

In use, the panel 16,16' described may include a cassette or enclosure to shield the element from exposure to actinic radiation, much in the manner a cassette shields an X-ray film. FIG. 5 shows such an arrangement in which a cassette or enclosure 22 is used. The cassette 22 is made of material which is opaque to ambient actinic radiation but transparent to X-rays. Since the ambient levels of gamma radiation are not usually high enough to present any exposure problems, it is not necessary that the material be opaque to gamma radiation. Similarly in the absence of ambient IR radiation, the enclosure need not be opaque thereto.

The enclosure 22 may include a hinge 24 hingedly connecting a top section 25 and a bottom section 27, allowing the cassette 22 to open and close at will.

The cassette 22 may further include electrical connecting means 34 which permit one to connect power source 30 via wiring 26 and 28 to the Cn line contact on the panel 16,16'. A switching means, such as switch 32, is again provided to permit applying and stopping the applying of the bias voltage 30 to the cassette 22. It is also possible to provide the cassette 22 with additional contacts which will permit electrical access to the Xn, Yn and Sn (depending on the panel structure chosen) lines, which may be used to obtain data from the panel 16,16' without removing it from the cassette 22.

Figure 6:
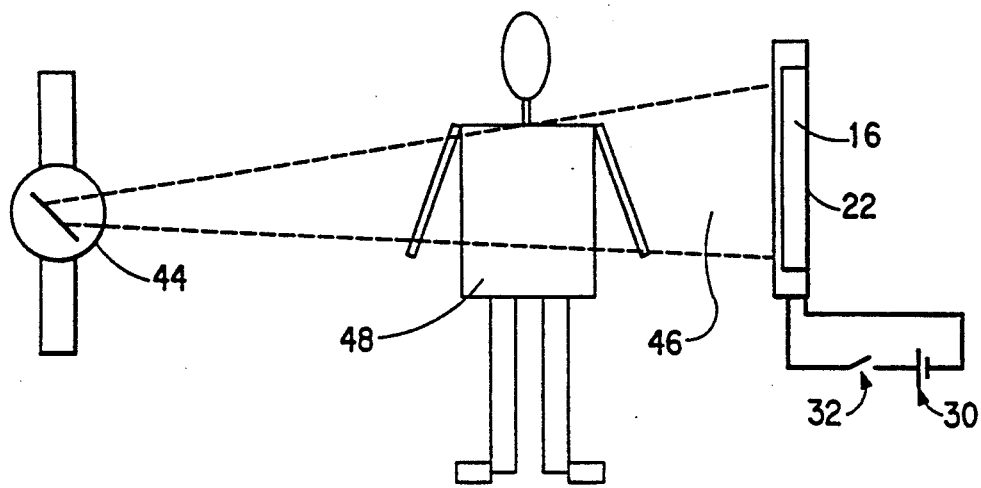
FIG. 6 shows in schematic representation an arrangement for using an X-ray panel in accordance with this invention for capturing a latent X-ray image.

To obtain a latent radiographic image, the element 16,16' is placed in cassette 22 and the cassette 22 is placed in the path of information modulated X-ray radiation in a manner similar to the way a traditional cassette-photosensitive film combination is positioned. This arrangement is schematically depicted in FIG. 6 which shows a source of X-ray radiation 44 emitting a beam of X-rays. A target 48, i.e., a patient in the case of medical diagnostic imaging, is placed in the X-ray beam path. The emerging radiation through the patient 48 is intensity modulated because of the different degree of X-ray absorption in the target 48. The modulated X-ray radiation beam 46 is then intercepted by the cassette 22 containing element 16 or 16'. X-rays penetrate the enclosure 22 and are eventually absorbed by the photoconductive layer 8 altering its apparent resistivity in proportion to the radiation intensity along the X-ray paths therethrough. Viewed in a different way, the X-rays generate a flow of electron hole pairs, of which the electrons are accumulated in the interface between the photoconductive layer 8 and the dielectric layer 6. Switch 32 is closed during the exposure step in synchronization therewith, or prior thereto, applying a bias D.C. voltage from source 30 to the element 16 or 16'.

After a predetermined first time period, the X-ray flux is interrupted and X-rays no longer impinge on the element 16,16'. The application of the bias voltage 30 is then either simultaneously or soon thereafter removed from the element 16,16' by opening the switch 32.

Following removal of the bias voltage 30 from the element 16, the cassette 22 may be opened. The element 16 can be handled in the presence of actinic radiation without loss of the stored image information contained in it as a charge distribution in the microcapacitors in the dielectric layer 6. The presence of this charge and the operation of the panel 16 in capturing an image in the form of a charge distribution will be explained below. Preferably at this point, the element 16 is intentionally exposed to a large dose of actinic radiation, as by a flash exposure, to eliminate the charges stored in the photoconductive layer 8, by momentarily rendering such photoconductive layer 8 substantially conductive. The layer 8 behaves as substantially conductive, because the abundant illumination produces an ample supply of electron hole pairs, in effect, neutralizing any charges stored in the photoconductive layer 8.

Figure 7:
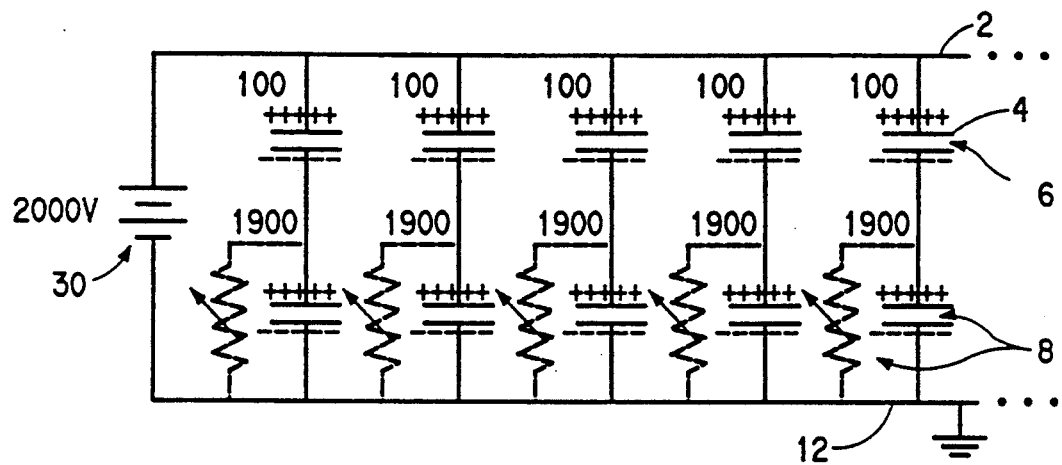
FIG. 7 represents an electrical equivalent of an element in accordance with the present invention prior to exposure to X-ray radiation.

The combination of the dielectric and photoconductive layers 6,8 between each one of the conductive microplates 4 and the backing layer 12 behave as two capacitors in series, one representing the dielectric, the other the photoconductor as shown in FIG. 7 which represent an equivalent electric circuit of the combination of the transparent electrode 4, the dielectric layer 6, the photoconductive layer 8 and the backing conductive layer 12. In parallel with the photoconductive layer 8, there is shown a variable resistance in dotted lines representing the effect of the electron hole pair generation in the photoconductive layer 8.

When voltage supply 30 is connected across the element as shown in FIG. 7, in the absence of actinic or X-ray radiation, the microcapacitors are all charged uniformly the charge being a function of the capacitance of each capacitor. In the present case where all capacitors have the same area plates, the capacitance will depend on the plate separation and dielectric constant of the material between the plates. In the described structure, this will result in two different voltages appearing across the capacitors, one in the capacitors representing the photoconductor layer 8, the other in the dielectric layer 6. If, for instance, the applied voltage difference from the bias source 30 is 2000 Volts, it could be distributed across the two capacitors as 100 volts across the dielectric 6 and 1900 volts across the photoconductor 8.

Figure 8:
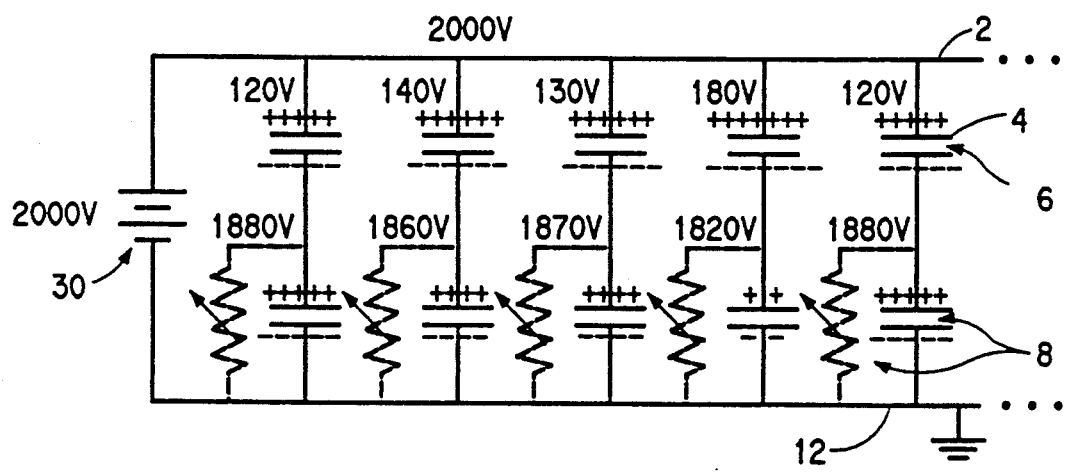
FIG. 8 represents an electrical equivalent of an element in accordance with this invention just after exposure to X-ray radiation.

When the element 16 is exposed to X-ray radiation, the overall voltage does not change, but because of the generation and movement of electron hole pairs, there is a new charge distribution in each of the microcapacitors, dependent on the radiation intensity incident on each of the microcapacitors, which produces a new voltage distribution between the two series connected microcapacitors. FIG. 8 shows schematically such a hypothetical consequential voltage redistribution.

Figure 9:
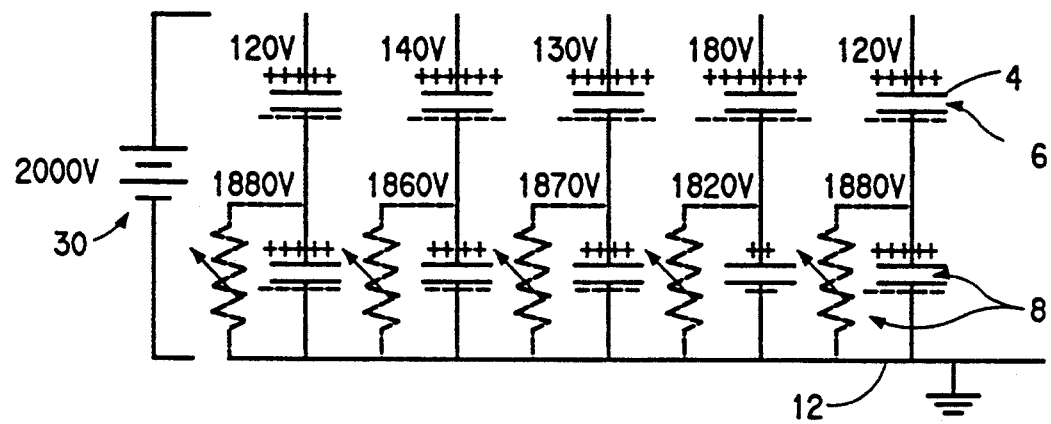
FIG. 9 represents an electrical equivalent of an element in accordance with this invention just after exposure to X-ray radiation and removal of a bias voltage.

After termination of the X-ray exposure, the switch 32 is opened disconnecting the source 30 from the element 16 and terminating the application of the bias voltage 30 along line 2 to the microplates 4. At this stage each of the microplates 4 is isolated by the diodes 7 from all others and stands alone. FIG. 9 shows the voltage distribution at this point. The charges having nowhere to go remain fixed as they were at the end of the X-ray exposure time period. At this time the voltage source 30 may be completely removed from contact with the element 16 or the cassette 22.

Figure 10:
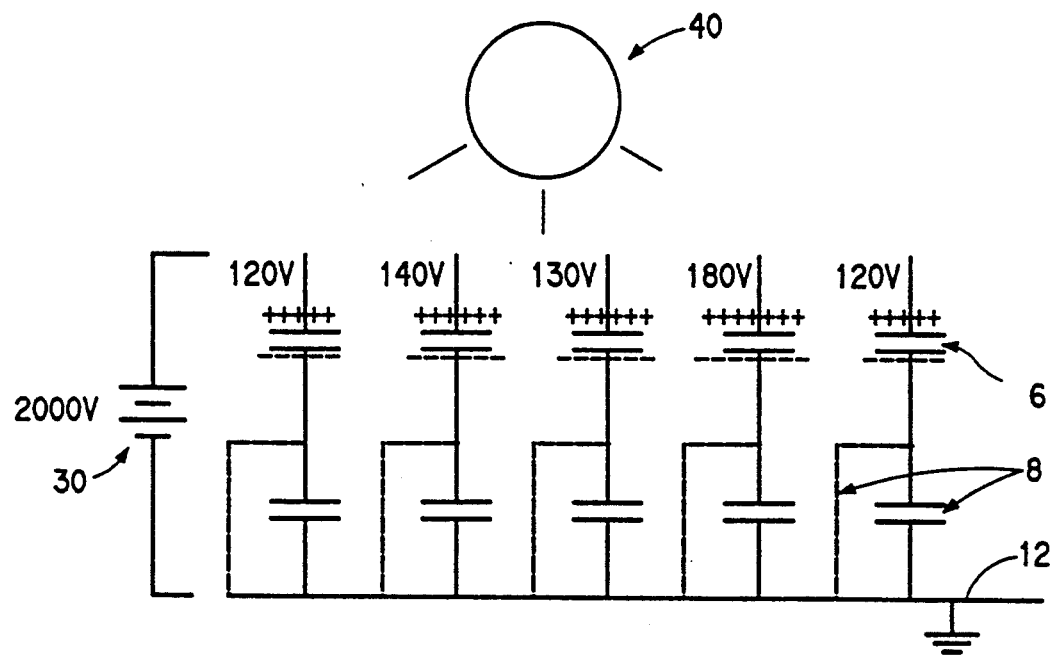
FIG. 10 represents an electrical equivalent of the element just after a uniform actinic exposure following exposure to X-ray radiation and removal of the bias voltage.

The total voltage appearing across each capacitor pair is still 2000 volts. However, the charges in the dielectric portion of each capacitor pair are no longer uniform across the full surface of element 16 (or 16"), but vary representing a latent radiographic image. In order to reduce the overall voltage, it is preferred at this stage to flash expose the element 16 with actinic radiation from an appropriate source 40, as shown in FIG. 10. The result of such flash exposure, which is done in the absence of a bias voltage 30, is to discharge each of the microcapacitors representing the photoconductive layer 8 in essence bringing one end of each of the dielectric microcapacitors to essentially ground potential. This has the advantage that on readout of the image, which in certain modes entails discharging sequentially each microcapacitor, the potential difference between a fully discharged microcapacitor microplate 4 and an adjacent undischarged as yet microcapacitor microplate 4 is less than it would be if the flash exposure had not occurred. This in turn results in a lesser chance of undesirable arcing between microcapacitors or transistor breakdown.

It is readily realized of course that the flash exposure, while preferably done using actinic radiation, can also be performed using additional, unmodulated X-ray radiation.

An electric signal representing the latent radiographic image captured in the microcapacitors of the element 16 as varying amounts of stored electrical charge is read out by exposing the element 16 to uniform actinic radiation and while doing so, sequentially addressing each of the Xn lines and applying a voltage to the gate of the FETs 5 connected to the Xn line. This results in rendering the FETs 5 conductive and sending the charges stored in the corresponding microcapacitors along the Sn lines. If the circuit of FIG. 2 is used, the charge amplifiers 36 produce each a voltage output proportional to the charge detected on the line Sn. The output of the charge detectors 36 may next be sequentially sampled to obtain an electrical signal representing the charge distribution along the addressed Xn line, each microcapacitor representing one image pixel. The next Xn line is then addressed and the process repeated till all the microcapacitors have been sampled and the full image has been read out. The electrical signal output may be stored or displayed or both.

When the panel 16 of FIG. 2a is used, the operation is practically identical, differing in that the lines Sn are sampled sequentially rather than the charge detectors outputs, and the sampled Sn line is connected to the one charge detector 36 input to produce an output voltage. This output voltage is then used as before to display or store an image.

The panel 16' of FIG. 4 is read somewhat differently, in that each microplate 4 and corresponding microcapacitor is sampled individually, rather than across a whole line as in FIG. 2a, by using two FETs 5' back to back. By addressing the Xn and Yn lines sequentially, a voltage appears across a Yn line at the gates of a line of microcapacitors, and another across an Xn line and a corresponding line of microcapacitors. In only one case, however, there appears a voltage at both an Xn and Yn gate of the two FETs 5' connected to the same microcapacitor, allowing the charge stored therein to flow to the sense line Sn and therefrom to the charge detector 36, providing an output signal for that particular microcapacitor and consequentially pixel. Thus, the scanning operation in this case occurs by the use of dedicated scan lines Xn and Yn and the signal is obtained also on a dedicated signal line.

Figure 11:
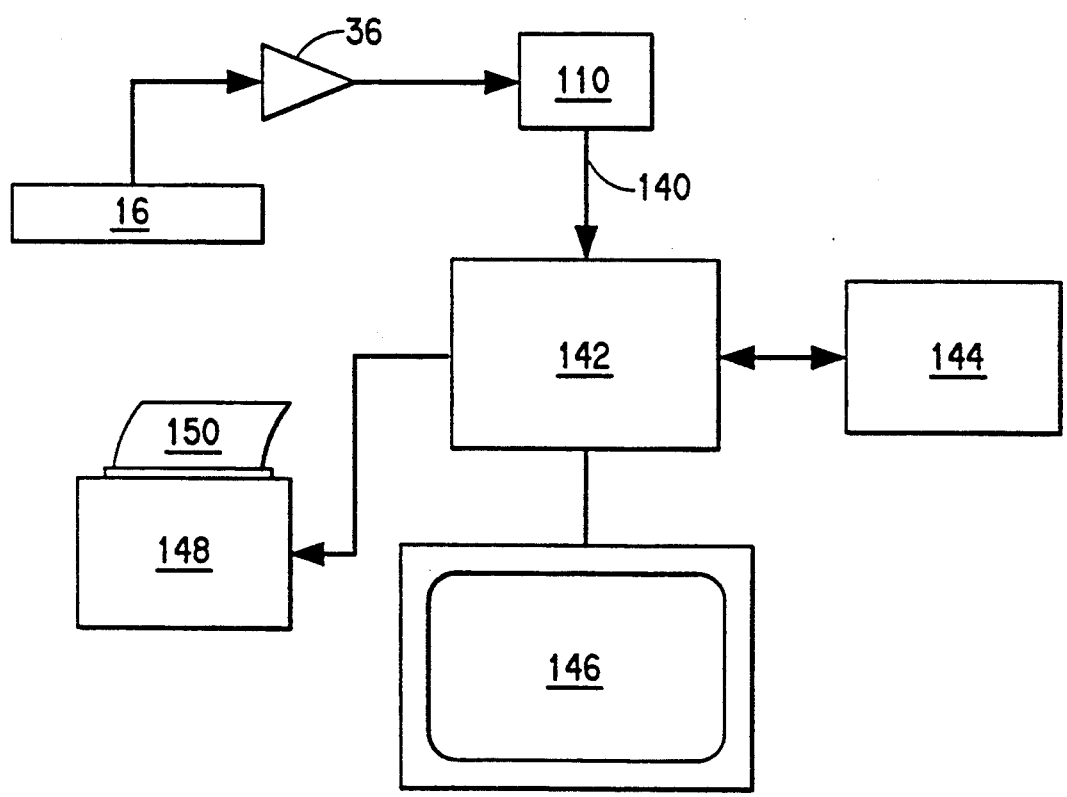
FIG. 11 is a block diagram of an arrangement for the capture and display of a radiogram in accordance with this invention.

The signal obtained from the detector 36 is preferably converted to a digital signal, in an analog to digital (A/D) converter 110, as shown in FIG. 11. From the A/D converter 110 the signal is directed over line 140 to a computer 142. Computer 142 inter alia directs the signal to appropriate storage means which may be both a internal RAM memory or a long term archival memory 144 or both. In the process, the data representing the radiogram may undergo image processing, such as filtering, contrast enhancement, and the like, and it may be displayed on a CRT 146 for immediate viewing or it may be used in a printer 148 to produce a hard copy 150.

The examples and suggested systems illustrated and discussed in this specification are intended only to teach those skilled in the art the best way known to the inventors to make and use their invention. Thus, the specific embodiments of this specification should be considered as illustrative rather than limiting the scope of the present invention. Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. An X-ray image capture element, comprising:
   a first, electrically conductive, backing layer a second, photoconductive layer responsive to both actinic and X-ray radiation extending substantially over said backing layer a third, dielectric layer substantially transparent to both actinic and X-ray radiation, the dielectric layer having a back surface extending substantially over and in contact with said photoconductive layer and a front surface;
   a plurality of discrete conductive microplates substantially transparent to both actinic and X-ray radiation, said microplates arranged on said front surface with a space between adjacent microplates, each of said microplates having dimensions coextensive with a minimum resolvable picture element;
   a first plurality of discrete conductive Xn address lines extending along the microplates;
   a second plurality of interconnected conductive charge lines extending along said microplates;
   a third plurality of discrete conductive Sn sense lines extending along said microplates; and
   each microplate being connected to one adjacent of said plurality of charge lines with a diode and to said Xn address and sense lines via a transistor.

2. The element in accordance with claim 1, further comprising a fourth plurality of discrete Yn address conductive lines extending along the microplates in a direction across the Xn address lines, and wherein each of the microplates is connected to one of the Xn address lines, one of the Yn address lines and one of the Sn sense lines via at least two transistors.

3. The element in accordance with claim 2, wherein the plurality of the Xn address and Yn address lines are laid out orthogonally on the front surface of the dielectric layer in the spaces between the microplates.

4. The element in accordance with claim 1 or 2, wherein the transistors are FET transistors.

5. The element in accordance with claim 1 or 2, further comprising a charge barrier layer extending between the photoconductive layer and the backing layer and the photoconductive layer comprises selenium.

6. The element in accordance with claim 1 or 2, wherein the photoconductive layer comprises aluminum and the photoconductive layer is over an aluminum oxide layer which substantially covers a surface of the conductive layer.

7. A method for capturing a radiogram on an X-ray image capture element, comprising:
   a first, electrically conductive, backing layer;
   a second, photoconductive layer responsive to both actinic and X-ray radiation extending substantially over said backing layer;
   a third, dielectric layer substantially transparent to both actinic and X-ray radiation, the dielectric layer having a back surface extending substantially over and in contact with said photoconductive layer and a front surface;
   a plurality of discrete conductive microplates substantially transparent to both actinic and X-ray radiation, said microplates arranged on said front surface with a space between adjacent microplates, each of said microplates having dimensions coextensive with a minimum resolvable picture element, the microplates and backing layer forming a plurality of microcapacitors;
   a first plurality of discrete conductive Xn address lines extending along the microplates;
   a second plurality of interconnected conductive charge lines extending along said microplates;
   a third plurality of discrete conductive sense lines extending along said microplates and terminating in an input of one or more charge detecting devices for producing an output signal representative of the charge detected in the input of the one or more charge detecting devices; and
   each microplate being connected to one adjacent of said plurality of charge lines with a diode and to said Xn address sense lines via a transistor, the method comprising:
   (a) preventing actinic radiation from impinging on said element for a first time period;
   (b) applying a positive voltage across said interconnected charge lines to develop an electric potential difference between said plurality of discrete conductive microplates and said backing layer;
   (c) impinging imagewise modulated X-ray radiation for during the first time period onto the element;
   (d) after the first time period, stopping the applying step to trap in the microcapacitors electrical charges proportional to the intensity of the impinging radiation on the microplates;
   (e) after step (d), illuminating the element with uniform actinic radiation and applying a positive voltage to one of said plurality of Xn address lines to render the transistors connecting said one Xn address line and the sense lines to the microplates conductive to discharge said microcapacitors into the sense lines and the one or more charge detecting devices and produce an output signal on the one or more charge detecting devices;
   (f) sequentially detecting the output signals for each sense line; and
   (g) repeating steps (e) and (f) for each of said plurality of X-address lines until all signals from all microplates have been detected.

8. A method for capturing a radiogram on an X-ray image capture element, comprising:
   a first, electrically conductive, backing layer;
   a second, photoconductive layer responsive to both actinic and X-ray radiation extending substantially over said backing layer;
   a third, dielectric layer substantially transparent to both actinic and X-ray radiation, the dielectric layer having a back surface extending substantially over and in contact with said photoconductive layer and a front surface;
   a plurality of discrete conductive microplates substantially transparent to both actinic and X-ray radiation, said microplates arranged on said front surface with a space between adjacent microplates, each of said microplates having dimensions coextensive with a minimum resolvable picture element, the microplates and backing layer forming a plurality of microcapacitors;
   a first plurality of discrete conductive Xn address lines extending along the microplates;
   a second plurality of interconnected conductive charge lines extending along said microplates;
   a third plurality of conductive Yn address lines extending along said microplates in a direction across said first plurality of Xn address lines;
   a fourth plurality of conductive sense lines extending along said microplates;
   each microplate being connected to one adjacent of said plurality of charge lines with a diode; and
   each microplate also connected to said Xn address, Yn address, and sense lines via two transistors, the method comprising:
   (a) preventing actinic radiation from impinging on said element for a first time period;
   (b) applying a positive voltage across said interconnected charge lines to develop an electric potential difference between said plurality of discrete conductive microplates and said backing layer;
   (c) impinging imagewise modulated X-ray radiation during the first time period onto the element;
   (d) after the first time period, stopping the applying step to store in the microcapacitors electrical charges proportional to the intensity of the impinging radiation on the microplates;
   (e) after step (d), exposing the element to uniform actinic radiation and applying a voltage to one of said Yn address lines and one of said plurality of Xn address lines to render the transistors connecting said one Xn address line, said one Yn address line and one of said sense lines to one of said microplates conductive so as to produce an output signal on said one sense line;
   (f) detecting the output signal on said one sense line; and
   (g) repeating steps (e) and (f) for each of said plurality of Yn address and Xn address lines until all signals from all microplates have been detected.

9. The method in accordance with claim 7 or 8, further comprising:
   between steps (d) and (e), exposing the element to uniform actinic radiation for a second time period.

* * * * *